(12) United States Patent
Wang et al.

(10) Patent No.: US 8,570,765 B2
(45) Date of Patent: Oct. 29, 2013

(54) CIRCUIT BOARD WITH VIA HOLE AND ELECTRONIC DEVICE EQUIPPED WITH THE SAME

(75) Inventors: Cheng-Yu Wang, Taipei (TW); Chang-Hsu Yen, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 207 days.

(21) Appl. No.: 12/873,315

(22) Filed: Aug. 31, 2010

(65) Prior Publication Data
US 2012/0051008 A1  Mar. 1, 2012

(51) Int. Cl.
*H05K 7/02* (2006.01)
*H05K 7/04* (2006.01)

(52) U.S. Cl.
USPC ............................ 361/807; 361/809; 361/810

(58) Field of Classification Search
USPC ......... 361/807, 720, 721, 748, 760, 809, 810, 361/681–683; 174/138 E, 138 G
See application file for complete search history.

(56) References Cited

U.S. PATENT DOCUMENTS

| | | | | |
|---|---|---|---|---|
| 5,090,918 | A * | 2/1992 | Zoellick et al. | 439/487 |
| 5,326,937 | A * | 7/1994 | Watanabe | 174/263 |
| 5,420,378 | A * | 5/1995 | Estes et al. | 174/263 |
| 5,668,699 | A * | 9/1997 | Bell et al. | 361/753 |
| 6,295,210 | B1 * | 9/2001 | Lanzone et al. | 361/799 |
| 6,304,450 | B1 * | 10/2001 | Dibene et al. | 361/704 |
| 6,388,206 | B2 * | 5/2002 | Dove et al. | 174/262 |
| 6,521,842 | B2 | 2/2003 | Brinthaupt | |
| 7,750,765 | B2 * | 7/2010 | Kushta et al. | 333/260 |
| 7,898,820 | B2 * | 3/2011 | Kao et al. | 361/807 |
| 8,159,833 | B2 * | 4/2012 | Ishii et al. | 361/799 |
| 2012/0063093 | A1 * | 3/2012 | Meinel et al. | 361/707 |

FOREIGN PATENT DOCUMENTS

TW    M379953    5/2010

* cited by examiner

*Primary Examiner* — Hung S Bui
(74) *Attorney, Agent, or Firm* — CKC & Partners Co., Ltd.

(57) ABSTRACT

A circuit board includes a main body, an electronic component, a fixing portion and at least one via hole. The electronic component and the fixing portion are disposed on the main body. The at least one via hole is formed on the main body and adjacent to the fixing portion.

7 Claims, 10 Drawing Sheets

CIRCUIT BOARD WITH VIA HOLE AND ELECTRONIC DEVICE EQUIPPED WITH THE SAME

BACKGROUND OF THE INVENTION

1. Field of the Invention

The invention relates to a circuit board and, more particularly, to a circuit board for an electronic device.

2. Description of the Prior Art

Referring to FIGS. 1 and 2, FIG. 1 is a partial sectional view illustrating an electronic device 1 of the prior art, and FIG. 2 is a top view illustrating the circuit board 14 shown in FIG. 1. As shown in FIG. 1, the electronic device 1 comprises a top casing 10, a bottom casing 12 and a circuit board 14 disposed between the top and bottom casings 10 and 12. As shown in FIG. 2, the circuit board 14 comprises a main body 140, a plurality of electronic components 142 and a plurality of fixing portions 144. The electronic components 142 and the fixing portions 144 are disposed on the main body 140. In general, the fixing portion 144 is made of metal. In practical applications, the electronic components 142 can be central processing unit (CPU), north bridge chip, south bridge chip, Complementary Metal-Oxide-Semiconductor (CMOS), graphic card and so on, and will generate heat while being operated for a span of time.

As shown in FIG. 1, the top casing 10 has a fixing portion 100 including a plastic protrusion and a metal nut (not shown) disposed therein, and the bottom casing 12 has a fixing portion 120 including a plastic protrusion and a metal nut (not shown) disposed therein. A fixing member 16 (e.g. screw) can pass through the fixing portion 120 of the bottom casing 12, the fixing portion 144 of the circuit board 14 and the fixing portion 100 of the top casing 10 so as to fix the circuit board 14 between the top and bottom casings 10 and 12.

When the electronic device 1 is working, heat generated by the electronic components 142 is transferred to the fixing portion 144 via the main body 140 and then transferred to the outside surfaces of the top and bottom casings 10 and 12 via the fixing portions 100 and 120. Consequently, the surface temperature of the electronic device 1 will get higher and higher and may exceed the standard temperature, such that the outer partial surface may get overheated.

SUMMARY OF THE INVENTION

Therefore, an objective of the invention is to provide a circuit board with at least one via hole formed adjacent to a fixing portion and/or an electronic component thereon.

According to one embodiment of the invention, a circuit board comprises a main body, an electronic component, a fixing portion and at least one via hole. The electronic component and the fixing portion are disposed on the main body. The at least one via hole is formed on the main body and adjacent to the fixing portion.

According to another embodiment of the invention, a circuit board comprises a main body, an electronic component, a fixing portion and at least one via hole. The electronic component and the fixing portion are disposed on the main body. The at least one via hole is formed on the main body and adjacent to the electronic component.

According to another embodiment of the invention, an electronic device comprises a top casing with a first fixing portion, a bottom casing with a second fixing portion, a circuit board disposed between the top and bottom casings, and a fixing member. The circuit board comprises a main body, an electronic component, a third fixing portion and at least one first via hole. The electronic component and the third fixing portion are disposed on the main body. The at least one first via hole is formed on the main body and adjacent to the third fixing portion. The fixing member passes through the first, second and third fixing portions so as to fix the circuit board between the top and bottom casings.

As mentioned in the above, since the invention forms at least one via hole on the main body and adjacent to the fixing portion of the circuit board or the electronic component, the at least one via hole can effectively isolate heat generated by the electronic component from being transferred to the fixing portion of the circuit board. Accordingly, the heat generated by the electronic component will not be transferred to the surfaces of the top and bottom casings of the electronic device. Consequently, the surface temperature of the electronic device can be maintained in a lower temperature even after a long-term usage and will not get overheated. The aforesaid lower temperature represents a comfortable temperature for a user when he or she uses the electronic device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
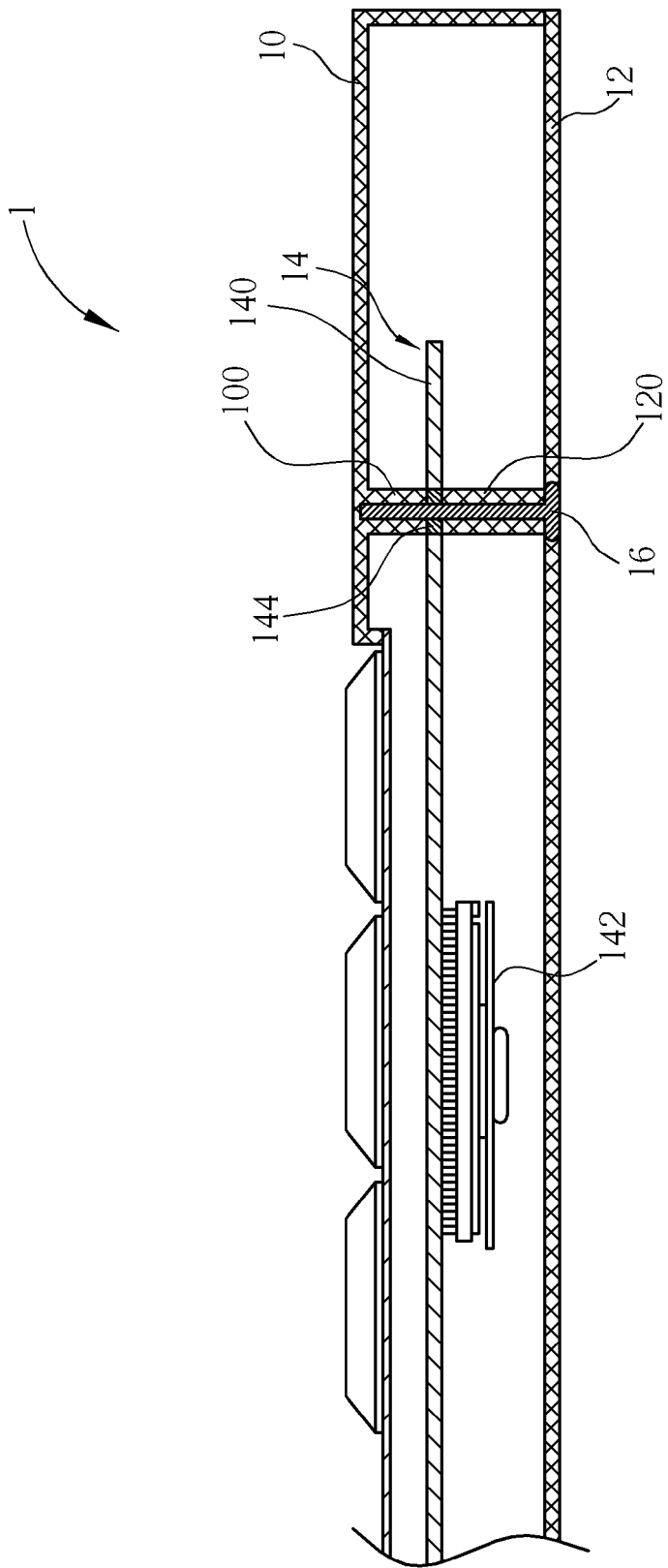
FIG. 1 is a partial sectional view illustrating an electronic device of the prior art.
Figure 2:
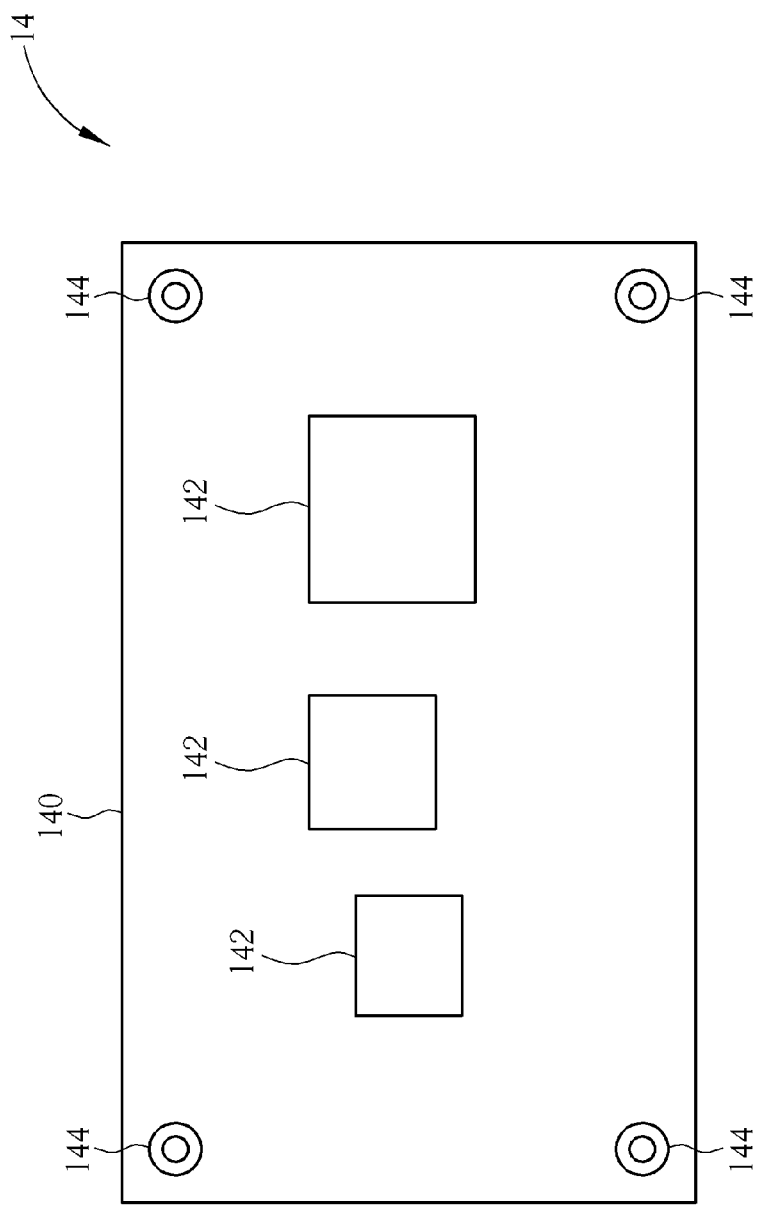
FIG. 2 is a top view illustrating the circuit board shown in FIG. 1.
Figure 3:
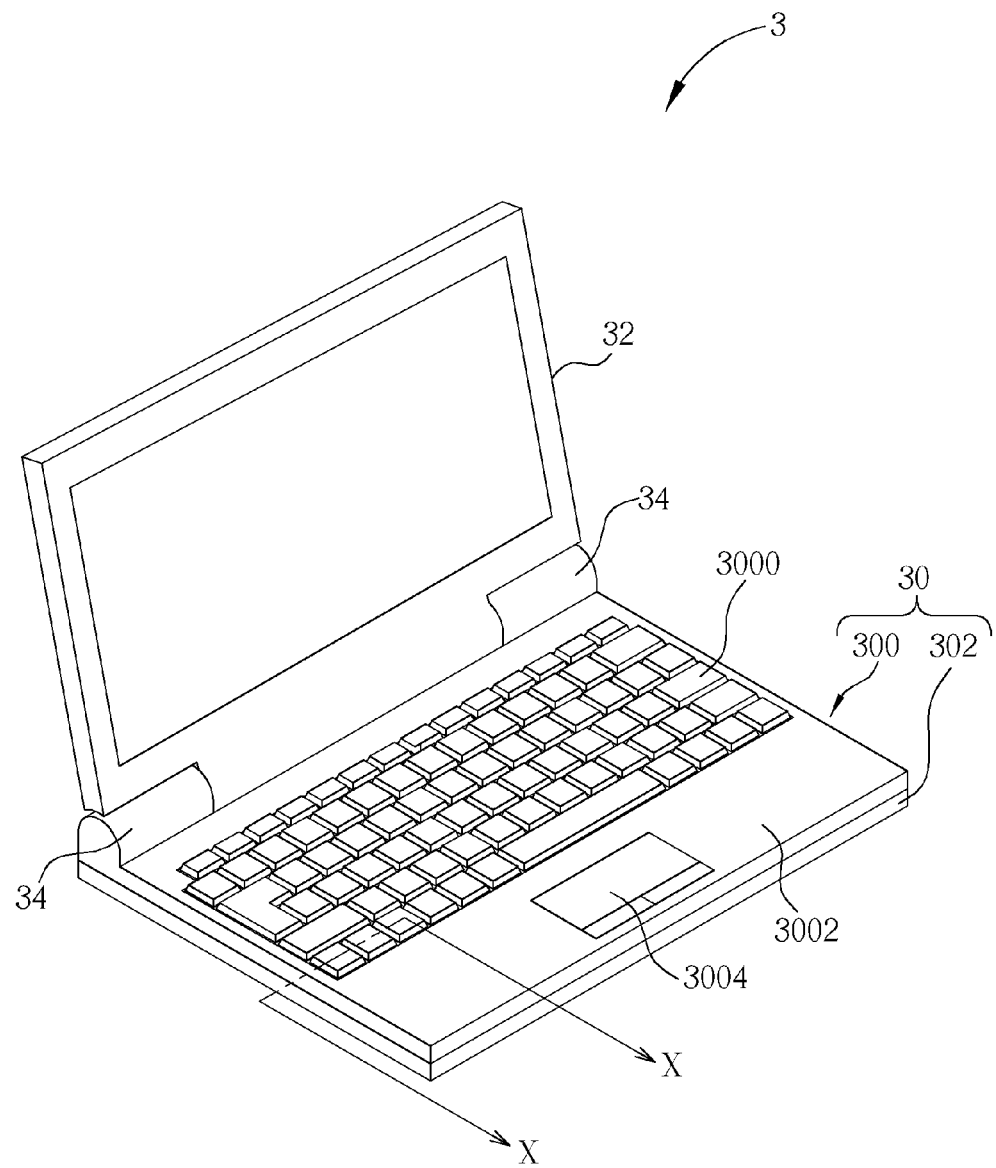
FIG. 3 is a perspective view illustrating an electronic device according to one embodiment of the invention.
Figure 4:
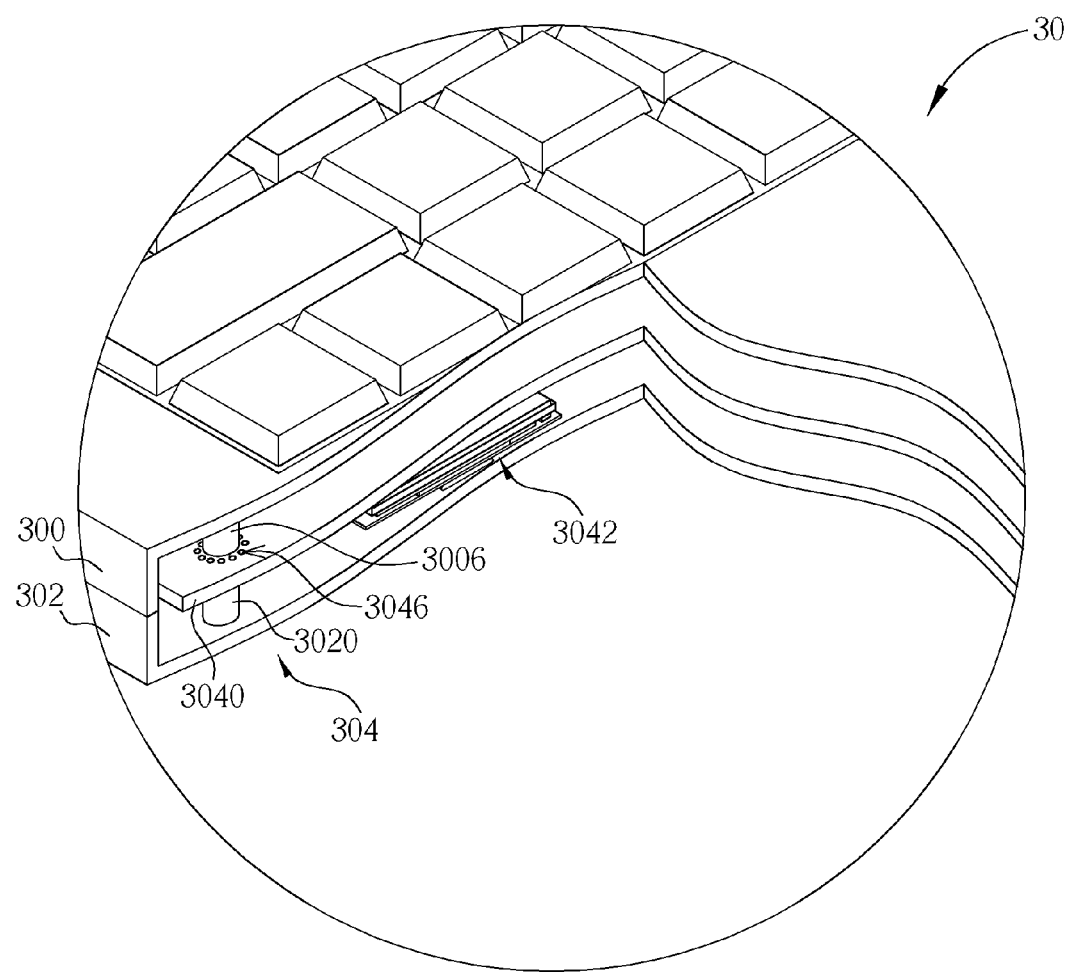
FIG. 4 is a perspective view illustrating parts of the electronic device shown in FIG. 3
Figure 5:
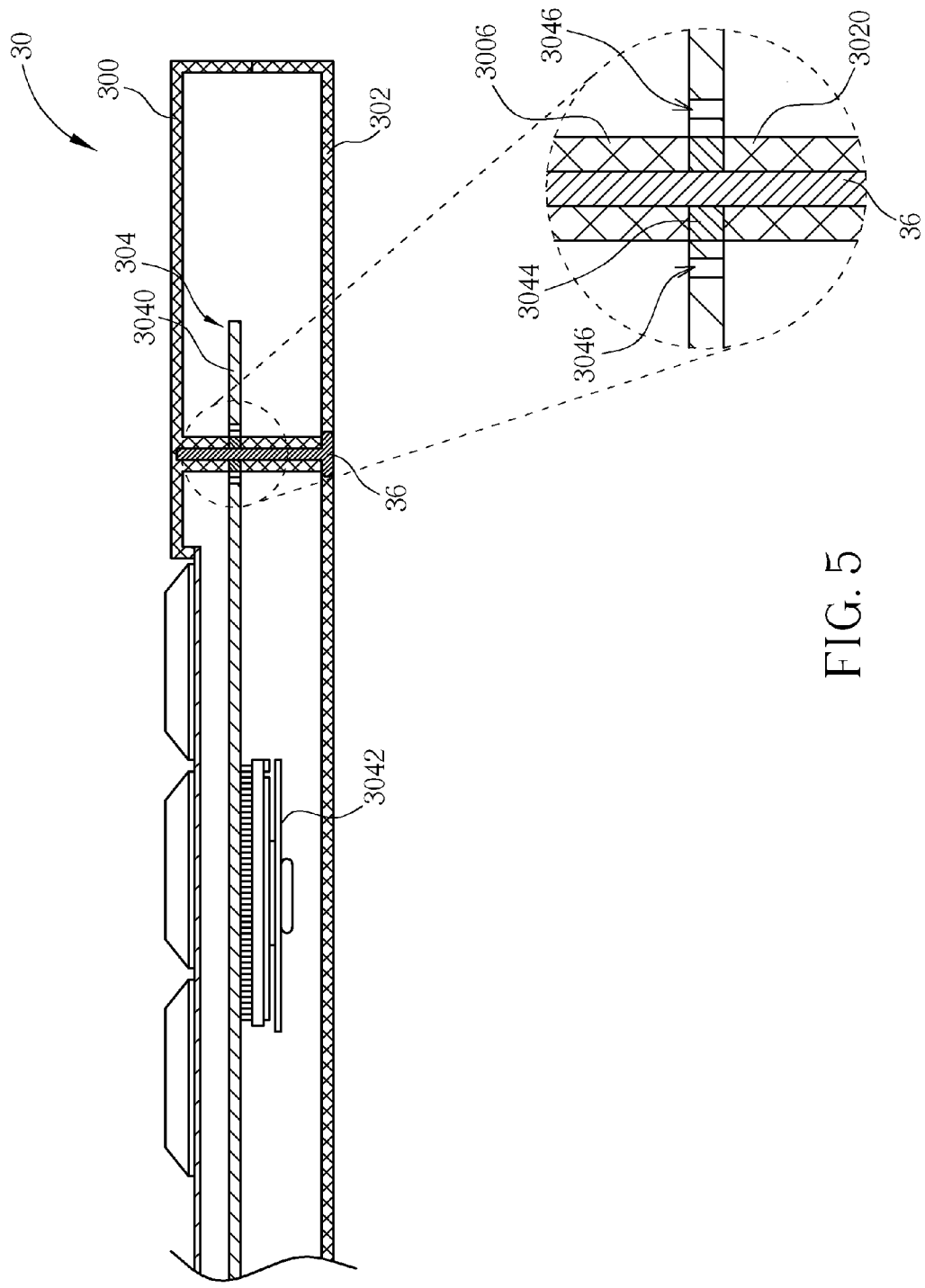
FIG. 5 is a partial sectional view illustrating the base shown in FIG. 3 along X-X line.
Figure 6:
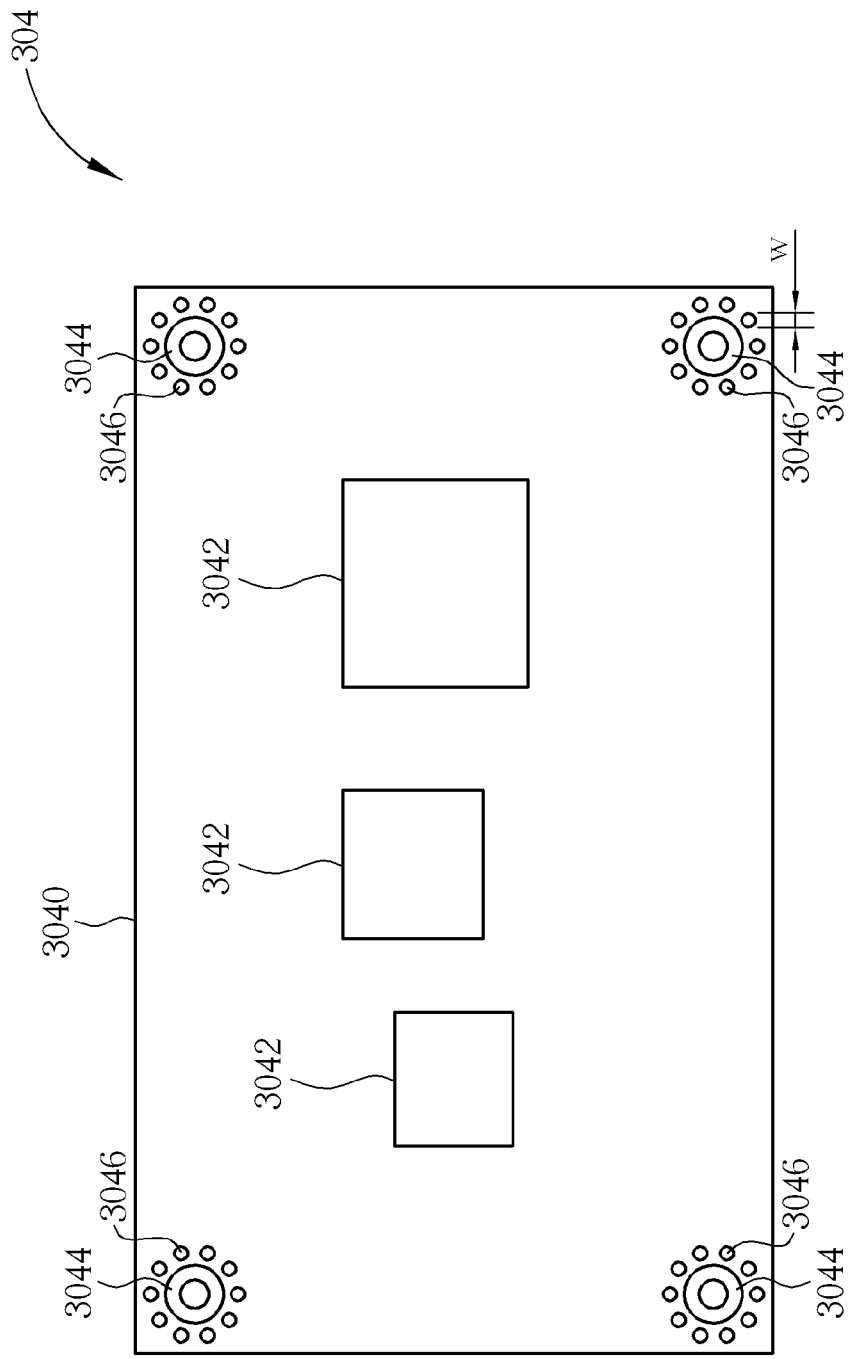
FIG. 6 is a top view illustrating the circuit board shown in FIG. 5.

Referring to FIGS. 3 to 6, FIG. 3 is a perspective view illustrating an electronic device 3 according to one embodiment of the invention, FIG. 4 is a perspective view illustrating parts of the electronic device 3 shown in FIG. 3, FIG. 5 is a partial sectional view illustrating the base 30 shown in FIG. 3 along X-X line, and FIG. 6 is a top view illustrating the circuit board 304 shown in FIG. 5. The electronic device 3 may be, but not limited to, a laptop computer. As shown in FIG. 3, if the electronic device 3 is a laptop computer, the electronic device 3 may comprise abase 30 and a display 32 pivotally connected to the base 30 by hinges 34 or the like. The base 30 comprises a top casing 300 and a bottom casing 302. In practical applications, the top casing 300 may comprise keyboard 3000, palm rest 3002 and touch pad 3004.

In this embodiment, the electronic device 3 further comprises a circuit board 304 disposed between the top and bottom casings 300 and 302, as shown in FIGS. 4 and 5. As shown in FIG. 6, the circuit board 304 comprises a main body 3040, a plurality of electronic components 3042, a plurality of fixing portions 3044 and at least one via hole 3046. The electronic components 3042 and the fixing portions 3044 are disposed on the main body 3040. In general, the fixing portion 3044 is made of metal. In practical applications, the electronic components 3042 can be central processing unit (CPU), north bridge chip, south bridge chip, Complementary Metal-Oxide-Semiconductor (CMOS), graphic card and so on, and will generate heat while being operated for a span of time. In this embodiment, there is a plurality of via holes 3046 formed on the main body 3040 and adjacent to each of the fixing portions 3044. However, it is noted that the type of the electronic components disclosed above is not limited thereto, and any electronic components that generate heat should be comprised in the scope of the invention.

It should be noted that the number of via holes 3046 formed adjacent to each fixing portion 3044 can be determined based on practical applications and is not limited to this embodiment shown in FIG. 6. Furthermore, the via holes 3046 can be arranged around each fixing portion 3044 symmetrically or randomly. Moreover, the via holes 3046 can be formed by laser cutting or other cutting process.

As shown in FIGS. 4 and 5, the top casing 300 has a fixing portion 3006 including a plastic protrusion and a metal nut (not shown) disposed therein, and the bottom casing 302 has a fixing portion 3020 including a plastic protrusion and a metal nut (not shown) disposed therein. A fixing member 36 (e.g. screw) can pass through the fixing portion 3020 of the bottom casing 302, the fixing portion 3044 of the circuit board 304 and the fixing portion 3006 of the top casing 300 so as to fix the circuit board 304 between the top and bottom casings 300 and 302. Since the via holes 3046 are formed on the main body 3040 and adjacent to the fixing portion 3044 of the circuit board 304, the via holes 3046 can effectively isolate heat generated by the electronic component 3042 from being transferred to the fixing portion 3044 of the circuit board 304. Accordingly, the heat generated by the electronic component 3042 will not be transferred to the surfaces of the top and bottom casings 300 and 302 of the electronic device 3 (as shown in FIG. 3). Consequently, the surface temperature of the electronic device 3 can be maintained in a lower temperature even after a long-term usage and will not get overheated. The aforesaid lower temperature represents a comfortable temperature for a user when he or she uses the electronic device 3.

As shown in FIG. 6, a shape of each via hole 3046 may be circular. It should be noted that a maximum width W of each via hole 3046 is preferably not smaller than 0.1 mm, otherwise the heat isolation effect will be reduced. On the other hand, the maximum width W of each via hole 3046 is preferably not larger than 3.5 mm, otherwise the structure strength of the circuit board 304 will be reduced if there are too many via holes 3046 formed around the fixing portion 3044. Therefore, in a best mode embodiment, the maximum width W of each via hole 3046 (i.e. a diameter of each via hole 3046) can be between, but not limited to, 0.1 mm and 3.5 mm, preferably 0.5 mm.

Figure 7:
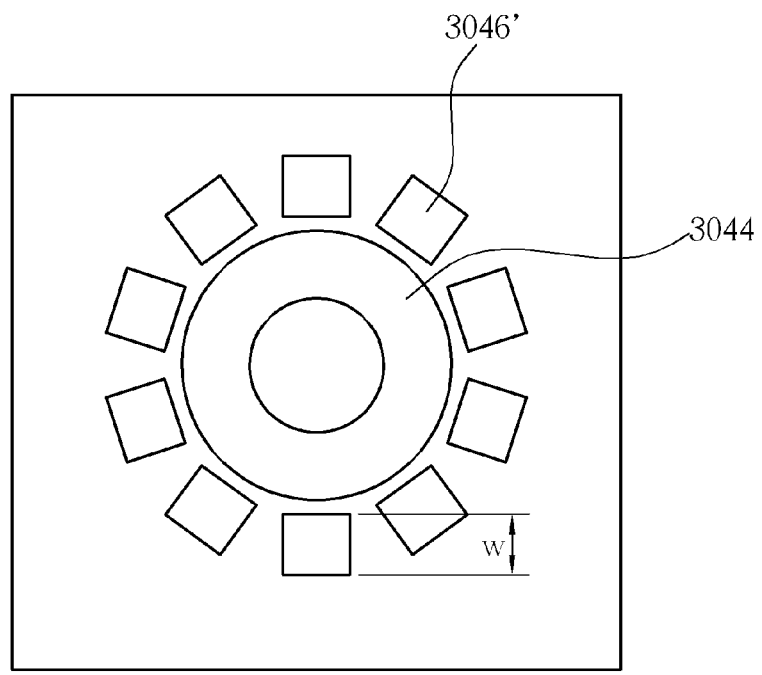
FIG. 7 illustrates two kinds of via holes different from the via hole shown in FIG. 6.
Figure 7:
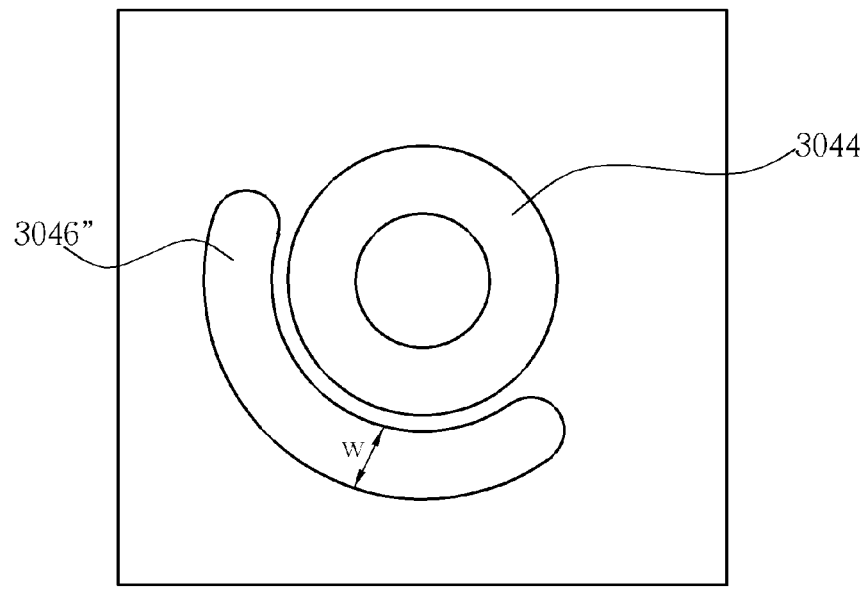

Referring to FIG. 7, FIG. 7 illustrates two kinds of via holes 3046' and 3046" different from the via hole 3046 shown in FIG. 6. As shown in FIG. 7, a shape of each via hole 3046' may be polygonal (e.g. rectangular) and a shape of the via hole 3046" may be groove-shaped. It should be noted that a maximum width W of each via hole 3046' or via hole 3046" is preferably not smaller than 0.1 mm, otherwise the heat isolation effect will be reduced. On the other hand, the maximum width W of each via hole 3046' or via hole 3046" is preferably not larger than 3.5 mm, otherwise the structure strength of the circuit board 304 will be reduced if there are too many via holes 3046' formed around the fixing portion 3044 or the via hole 3046" is too long. Therefore, in a best mode embodiment, the maximum width W of each via hole 3046' or via hole 3046" can be between, but not limited to, 0.1 mm and 3.5 mm, preferably 0.5 mm.

Figure 8:
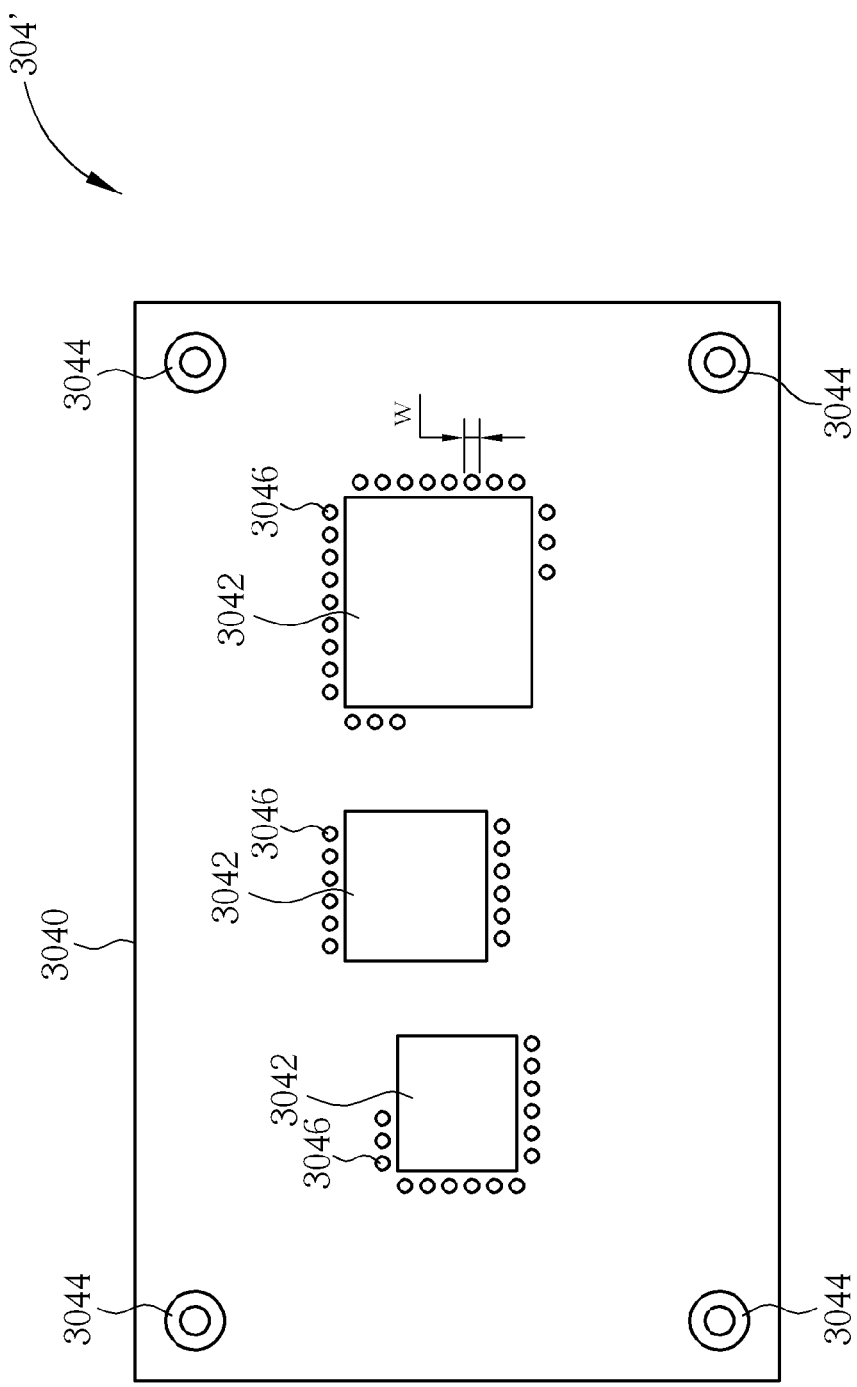
FIG. 8 is a top view illustrating a circuit board according to another embodiment of the invention.

Referring to FIG. 8, FIG. 8 is a top view illustrating a circuit board 304' according to another embodiment of the invention. As shown in FIG. 8, the main difference between the circuit board 304' and the aforesaid circuit board 304 is that the via holes 3046 are formed adjacent to the electronic component 3042 rather than the fixing portion 3044. Since the via holes 3046 are formed on the main body 3040 and adjacent to the electronic component 3042, the via holes 3046 can effectively isolate heat generated by the electronic component 3042 from being transferred to the fixing portion 3044 of the circuit board 304. Accordingly, the heat generated by the electronic component 3042 will not be transferred to the surfaces of the top and bottom casings 300 and 302 of the electronic device 3 (as shown in FIG. 3). Consequently, the surface temperature of the electronic device 3 can be maintained in a lower temperature even after a long-term usage and will not get overheated. The aforesaid lower temperature represents a comfortable temperature for a user when he or she uses the electronic device 3.

It should be noted that the number of via holes 3046 formed adjacent to each electronic component 3042 can be determined based on practical applications and is not limited to this embodiment shown in FIG. 8. Furthermore, the via holes 3046 can be arranged around each electronic component 3042 symmetrically or randomly. Moreover, the via holes 3046 can be formed by laser cutting or other cutting process.

Figure 9:
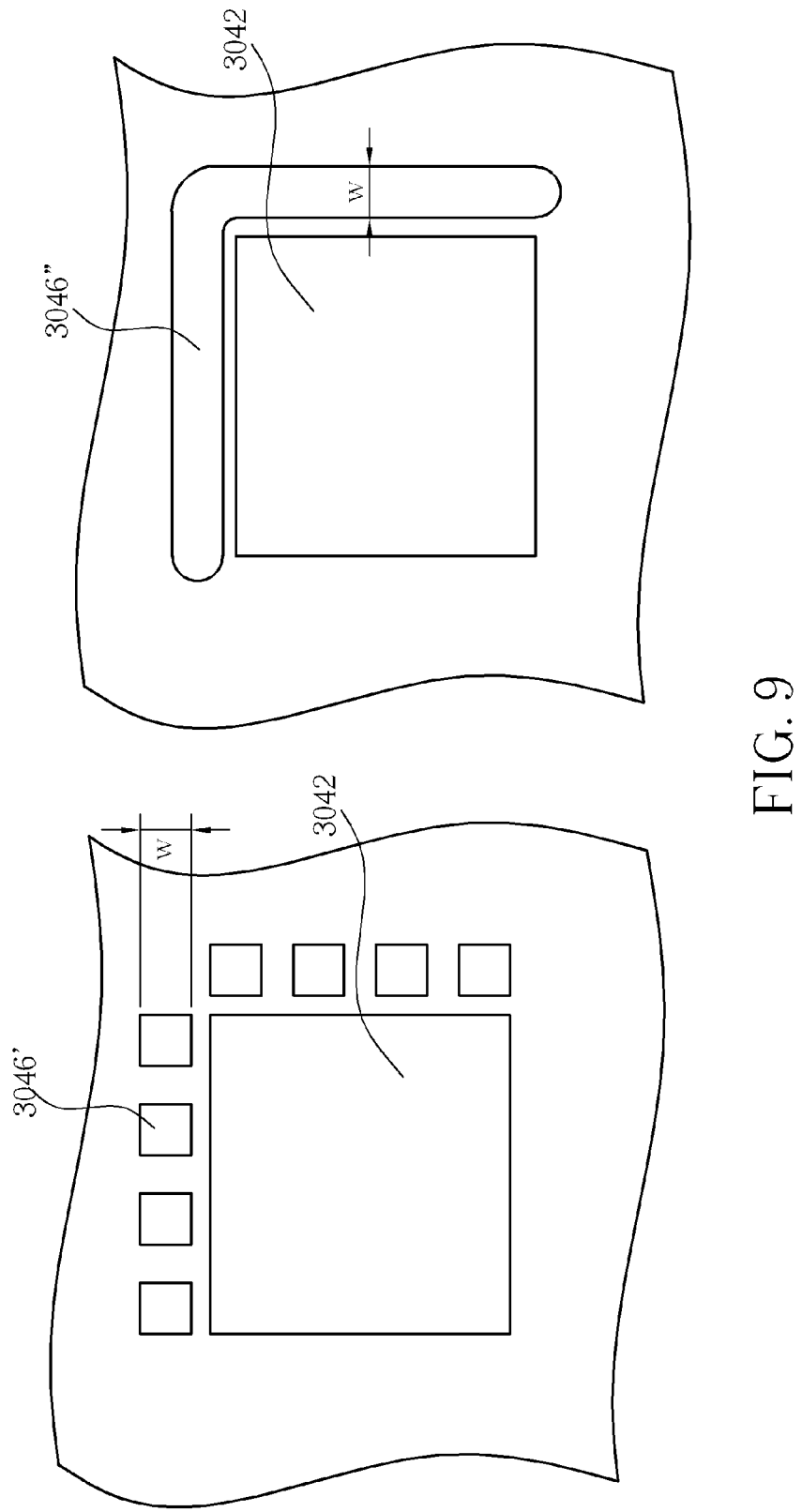
FIG. 9 illustrates two kinds of via holes and different from the via hole shown in FIG. 8.

Referring to FIG. 9, FIG. 9 illustrates two kinds of via holes 3046' and 3046" different from the via hole 3046 shown in FIG. 8. As shown in FIG. 9, the via holes 3046 of FIG. 8 can be replaced by the polygonal via holes 3046' (e.g. rectangular) or the groove-shaped via hole 3046" based on practical applications. Still further, the limitation of the maximum width W of each via hole 3046, 3046' or 3046" is depicted in the above and will not be repeated herein.

Figure 10:
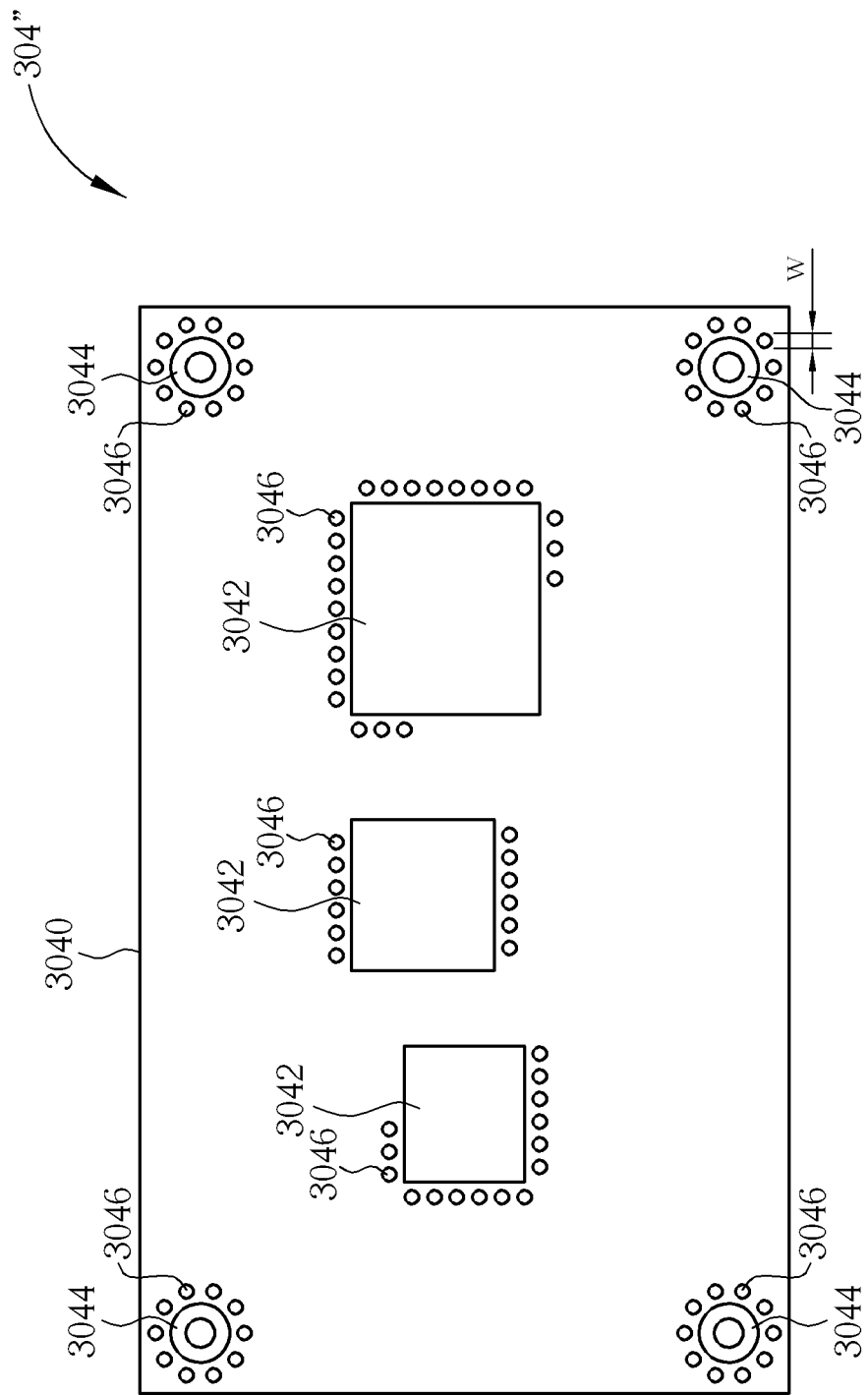
FIG. 10 is a top view illustrating a circuit board according to another embodiment of the invention.

However, it is noted that the shape of the via hole disclosed above is not limited thereto, and any shape of the via hole that achieves the same effect should be comprised in the scope of the invention Referring to FIG. 10, FIG. 10 is a top view illustrating a circuit board 304" according to another embodiment of the invention. As shown in FIG. 10, the main difference between the circuit board 304" and the aforesaid circuit board 304 is that a plurality of via holes 3046 is further formed adjacent to the electronic component 3042. Since the via holes 3046 are formed adjacent to the fixing portion 3044 and the electronic component 3042, the via holes 3046 can effectively isolate heat generated by the electronic component 3042 from being transferred to the fixing portion 3044 of the circuit board 304. Accordingly, the heat generated by the electronic component 3042 will not be transferred to the surfaces of the top and bottom casings 300 and 302 of the electronic device 3 (as shown in FIG. 3). Consequently, the surface temperature of the electronic device 3 can be maintained in a lower temperature even after a long-term usage and will not get overheated. The aforesaid lower temperature represents a comfortable temperature for a user when he or she uses the electronic device 3.

It should be noted that each of the via holes 3046 shown in FIG. 10 can be also replaced by the via holes 3046' or 3046" shown in FIGS. 7 and 9.

Compared to the prior art, since the invention forms at least one via hole on the main body and adjacent to the fixing portion of the circuit board and/or the electronic component, the at least one via hole can effectively isolate heat generated by the electronic component from being transferred to the fixing portion of the circuit board. Accordingly, the heat generated by the electronic component will not be transferred to the surfaces of the top and bottom casings of the electronic device. Consequently, the surface temperature of the electronic device can be maintained in a lower temperature even after a long-term usage and will not get overheated. The aforesaid lower temperature represents a comfortable temperature for a user when he or she uses the electronic device.

Those skilled in the art will readily observe that numerous modifications and alterations of the device and method may be made while retaining the teachings of the invention.

What is claimed is:

1. An electronic device comprising:
    a top casing with a first fixing portion;
    a bottom casing with a second fixing portion;
    a circuit board disposed between the top and bottom casings, the circuit board comprising:
    a main body;
    a third fixing portion disposed on the main body; and
    at least one first hollow through hole formed on the main body and adjacent to the third fixing portion to form a thermal isolating; and
    a fixing member passing through the first, second and third fixing portions so as to fix the circuit board between the top and bottom casings.

2. The electronic device of claim 1, wherein the at least one first hollow through hole is circular, polygonal or groove-shaped.

3. The electronic device of claim 1, wherein the circuit board further comprises an electronic component disposed on the main body.

4. The electronic device of claim 3, further comprising at least one second hollow through hole formed on the main body and adjacent to the electronic component.

5. The electronic device of claim 4, wherein the at least one second hollow through hole is circular, polygonal or groove-shaped.

6. An electronic device comprising:
    a top casing with a first fixing portion;
    a bottom casing with a second fixing portion;
    a circuit board disposed between the top and bottom casings, the circuit board comprising:
    a main body;
    a heat-generating electronic component disposed on the main body;
    a third fixing portion disposed on the main body; and
    at least one first hollow through hole formed on the main body and adjacent to the third fixing portion to form a first thermal isolating disposed between the third fixing portion and the heat-generating electronic component; and
    a fixing member passing through the first, second and third fixing portions so as to fix the circuit board between the top and bottom casings.

7. The electronic device of claim 6, further comprising at least one second hollow through hole formed on the main body and adjacent to the heat-generating electronic component to form a second thermal isolating disposed between the third fixing portion and the heat-generating electronic component.

* * * * *